United States Patent
Kwon et al.

(10) Patent No.: US 8,867,698 B2
(45) Date of Patent: Oct. 21, 2014

(54) COUNTING CIRCUIT, DELAY VALUE QUANTIZATION CIRCUIT, AND LATENCY CONTROL CIRCUIT

(75) Inventors: Dae-Han Kwon, Gyeonggi-do (KR); Yong-Ju Kim, Gyeonggi-do (KR); Jae-Il Kim, Gyeonggi-do (KR); Taek-Sang Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 61 days.

(21) Appl. No.: 13/620,564

(22) Filed: Sep. 14, 2012

(65) Prior Publication Data
US 2013/0216017 A1    Aug. 22, 2013

(30) Foreign Application Priority Data
Feb. 17, 2012    (KR) .................. 10-2012-0016494

(51) Int. Cl.
    *H03K 21/38*    (2006.01)
(52) U.S. Cl.
    USPC .......................................... 377/107; 377/118

(58) Field of Classification Search
    None
    See application file for complete search history.

(56) References Cited

U.S. PATENT DOCUMENTS

| | | | |
|---|---|---|---|
| 4,025,866 A * | 5/1977 | Fletcher et al. | 377/47 |
| 4,041,403 A * | 8/1977 | Chiapparoli, Jr. | 377/48 |
| 5,369,311 A * | 11/1994 | Wang et al. | 327/292 |
| 6,026,141 A * | 2/2000 | Lo | 377/111 |
| 7,609,800 B1 | 10/2009 | Lim et al. | |

FOREIGN PATENT DOCUMENTS

KR    100529036    11/2005

* cited by examiner

*Primary Examiner* — Tuan T Lam
(74) *Attorney, Agent, or Firm* — IP & T Group LLP

(57) ABSTRACT

A counting circuit includes: a clock division unit configured to divide a reference clock signal at a preset division ratio and generate a divided clock signal, a counting unit configured to count the divided clock signal, and a counting control unit configured to enable the counting unit during an enable period corresponding to the division ratio.

5 Claims, 4 Drawing Sheets

COUNTING CIRCUIT, DELAY VALUE QUANTIZATION CIRCUIT, AND LATENCY CONTROL CIRCUIT

CROSS-REFERENCE TO RELATED APPLICATIONS

The present application claims priority of Korean Patent Application No. 10-2012-0016494, filed on Feb. 17, 2012, which is incorporated herein by reference in its entirety.

BACKGROUND

1. Field

Exemplary embodiments of the present invention relate to a counting circuit, a delay value quantization circuit, and a latency control circuit.

2. Description of the Related Art

The integrated circuit has continuously improved the operation speed as well as the integration degree thereof. To improve the operation speed, a synchronous integrated circuit has emerged, which operates in synchronization with a clock signal applied from inside or generated from outside. Most operations of the synchronous integrated circuit are performed in synchronization with a clock signal. With the increase in the operation speed of the integrated circuit and the frequency of the clock signal used in the integrated circuit, securing a margin for a correct operation of the integrated circuit has become an important issue.

Meanwhile, the synchronous integrated circuit may perform a necessary operation by using information obtained by counting a clock signal. Hereafter, a case in which the integrated circuit uses information obtained by counting a clock signal during a data read operation of a memory will be taken as an example for description. When a read command is applied during a data read operation, the memory outputs data to the outside at a time point when a time that corresponds to a latency value passes from a time point when the read command is applied.

The reason why the memory does not immediately output data at the time point when the read command is applied, but outputs data to the outside at the time point when the time that corresponds to the latency value passes is that the memory requires a time for calling data stored therein and preparing output. For a mutual operation between integrated circuits A and B, a predetermined waiting time is required until the integrated circuit A requests the integrated circuit B to perform a certain operation, and the integrated circuit B performs the operation in response to the request. Such a waiting time refers to latency. For example, when CAS latency (CL) is set to seven, a memory transfers data to a memory controller after seven clocks from a time point when a read command is applied. Here, a circuit for controlling latency refers to a latency control circuit.

During the read operation of the memory, data, which are outputted to a memory cell in response to a read command, are stored in a pipe latch included in a data output circuit of the memory, and then outputted to the outside of the memory in response to a signal for deciding an output time point of the data (hereafter, referred to as an output signal). Such an output signal is activated at a time point when a time that corresponds to a latency value passes from a time point when the read command is applied, and generated by delaying the read command (or a signal activated in response to the read command). The latency control circuit delays the read command to generate the output signal. At this time, the read command not only may be delayed by the latency control circuit, but also may be delayed by internal components of the integrated circuit, positioned before and after the latency control circuit (hereafter, the delay value is referred to as a path delay value). When the latency control circuit delays the read command by the latency value, the output signal may be activated at a time point when the latency value and the path delay value pass from the time point when the read command is applied.

Therefore, the latency control circuit delays the read command by a difference between the latency value and the path delay value, instead of the latency value. At this time, the latency value is applied based on the clock signal, but the path delay value is not applied based on the clock signal. Therefore, the latency control circuit generates path information by quantizing the path delay value based on the clock signal for the above-described operation, and then performs an operation on the latency value and the path information to acquire a delay value by which the latency control circuit must actually delay the read command (based on the clock signal). Here, the path information may be generated by using a result outputted by counting the clock signal during the path delay value. The latency control circuit generates and stores the path information when the memory is powered on. Then, when a read command is applied, the latency control circuit delays and outputs the read command in consideration of the stored path information.

FIG. 1A is a configuration diagram of a conventional path information generation circuit.

Referring to FIG. 1A, the conventional path information generation circuit includes a delay unit 110 and a counting unit 120. The delay unit 110 is configured to delay a start signal ST by a path delay value, and the counting unit 120 is configured to count a clock signal CLK until an output of the delay unit 110 is activated from a time point when the start signal ST is activated.

When the start signal ST is activated, the counting unit 120 starts to count the clock signal CLK. When the start signal ST is delayed by the delay unit 110, the output of the delay unit 110 is activated. Then, when the output of the delay unit 110 is activated, the counting unit 120 ends counting the clock signal CLK. Here, because the delay value of the delay unit is equal to the path delay value, a difference between a time point when the start signal ST is activated and a time point when the output of the delay unit 110 is activated corresponds to the path delay value, and the counting unit 120 outputs a result K<0:A> that is obtained by counting the clock signal CLK by the path delay value.

FIG. 1B is a timing diagram that illustrates and explains the operation of the circuit of FIG. 1A.

The counting unit 120 starts to count the clock signal CLK from a time point T1 when the start signal ST is activated, and counts the clock signal CLK to a time point T2 when an output DEL_ST of the delay unit is activated. Here, a time between 'T1' and 'T2' corresponds to a path delay value CD. The output K<0:A> of the counting unit 120 may be obtained by quantizing the path delay value CD based on the clock signal CLK.

Here, a period M between rising edges R1 and R2 of the clock signal CLK, which are positioned before and after the time point T2 when the output DEL_ST of the delay unit is activated, becomes a margin for correctly counting the clock signal CLK during the path delay value CD. However, as the frequency of the clock signal CLK increases, such a margin may decrease to cause noise. In this case, the value obtained by counting the clock signal CLK during the path delay value CD may not be outputted correctly.

SUMMARY

Exemplary embodiments of the present invention are directed to a counting circuit, a delay value quantization circuit, and a latency control circuit, which is capable of increasing a clock counting margin during a counting operation, thereby correctly counting a clock signal.

In accordance with an exemplary embodiment of the present invention, a counting circuit includes a clock division unit configured to divide a reference clock signal at a preset division ratio and generate a divided clock signal, a counting unit configured to count the divided clock signal, and a counting control unit configured to enable the counting unit during an enable period corresponding to the division ratio.

In accordance with another embodiment of the present invention, a delay value quantization circuit includes a clock division unit configured to divide a reference clock signal and to generate a divided clock signal, a delay unit, a counting control unit configured to control the delay unit to delay a start signal for a preset number of times, and activate an end signal if an output signal of the delay unit is activated for the preset number of times, and a counting unit configured to count the divided clock signal from an activation time point of the start signal to an activation time point of the end signal.

In accordance with yet another embodiment of the present invention, a latency control circuit includes a clock division unit configured to divide a reference clock signal and generate a divided clock signal, a replica delay unit having a delay value corresponding to a path through which an input signal passes in an integrated circuit, a counting control unit configured to control the replica delay unit to delay a start signal, which is activated in response to the input signal, a preset number of times, and to activate an end signal if an output signal of the replica delay unit is activated for the preset number of times, a counting unit configured to count the divided clock signal from an activation time point of the start signal to an activation time point of the end signal, and to generate a path information corresponding to the delay value of the path through which the input signal passes in the integrated circuit, a delay information generation unit configured to generate a delay information indicating a value for delaying the input signal, using a latency information of the input signal and the path information, and a delay unit configured to delay the input signal by the delay information.

DETAILED DESCRIPTION

Figure 1A:
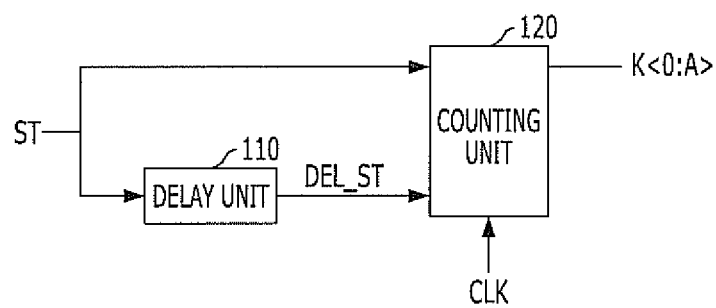
FIG. 1A is a configuration diagram of a conventional path information generation circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
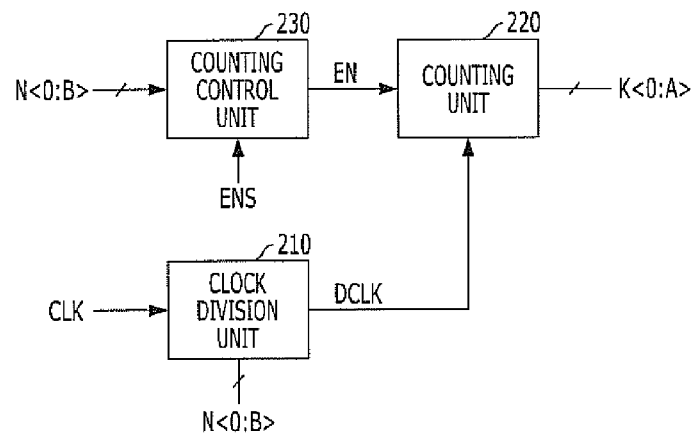
FIG. 2 is a configuration diagram of a counting circuit for improving a clock counting operation in accordance with an embodiment of the present invention.

FIG. 2 is a configuration diagram of a counting circuit for improving a clock counting operation in accordance with an embodiment of the present invention.

Referring to FIG. 2, the counting circuit includes a clock division unit 210, a counting unit 220, and a counting control unit 230. The clock division unit 210 is configured to divide a reference clock signal CLK at a preset division ratio and generate a divided clock DCLK. The counting unit 220 is configured to count the divided clock signal DCLK. The counting control unit 230 is configured to enable the counting unit 220 during an enable period corresponding to the division ratio.

Hereafter, the counting circuit will be described with reference to FIG. 2.

The clock division unit 210 generates the divided clock signal DCLK by dividing the clock signal CLK based on the preset division ratio. If the preset division ratio is 1/N, the frequency of the divided clock signal DCLK becomes 1/N of the frequency of the clock signal CLK, and the cycle of the divided clock signal DCLK becomes N times longer than the cycle of the clock signal CLK. For example, the frequency of the divided clock signal DCLK obtained by dividing the clock signal CLK having a frequency of 1 GHz at a division ratio of 1/4 becomes 250 MHz, and the cycle of the divided clock signal DCLK becomes 4 ns. Division information N<0:B> includes information on the division ratio. The clock division unit 210 may divide the clock signal CLK at a division ratio, which is decided based on the division information N<0:B>. However, the clock division unit 210 does not necessarily receive the division information N<0:B>, but the division information N<0:B> may be preset in the clock division unit 210.

The counting unit 220 generates counting information K<0:A> by counting the divided clock signal DCLK during the enable period. For this operation, the counting unit 220 counts the divided clock signal DCLK in response to an enable signal EN indicating the enable period. The counting information K<0:A> corresponds to information obtained by quantizing the length of the enable period of the counting unit 220 based on the divided clock signal DCLK.

The counting control unit 230 enables the counting unit 220 during an intended period and controls the counting unit 220 to count the divided clock signal DCLK. When the preset division ratio is 1/N, the counting control unit 230 sets the enable period to a period N times longer than an enable period when the division ratio is 1. For example, suppose that when the division ratio is 1, the enable period is 4 ns. In this case, when the division ratio is 1/4, the enable period may be set to 16 ns, which is four times longer than 4 ns.

For this operation, the counting control unit 230 generates the enable signal EN that indicates the enable period of the counting unit 220. If the preset division ratio is 1/N, the counting control unit 230 may enable the enable signal EN during the period N times longer than the enable period when the division ratio is 1. For example, suppose that when the division ratio is 1, the enable signal EN is activated for 4 ns. In this case, when the division ratio is 1/4, the enable signal EN may be activated for 16 ns. When the division ratio is 1, the enable period is decided by a source enable signal ENS inputted from the outside. The enable period of the enable signal EN is decided by the division information N<0:B> and the source enable signal ENS. The counting control unit 230 generates the enable signal EN by extending the source enable signal ENS to a multiple that corresponds to the division information N<0:A>. However, the counting control unit 230 does not necessarily receive the division information N<0:B>, but the division information N<0:B> may be preset.

Because the enable period of the counting unit 220 is set to the value that corresponds to the division ratio by the counting control unit 230, the output value of the counting unit 220 is the same regardless of the division ratio. For example, suppose that when the division ratio is 1, the frequency of the clock signal CLK is 1 GHz, and the enable period is 4 ns. In this case, because the frequency of the divided clock signal DCLK becomes 1 GHz and the cycle of the divided clock signal DCLK becomes 1 ns, the output K<0:A> of the counting unit becomes a digital signal that corresponds to 4 obtained by counting the divided clock signal DCLK four times. If the division ratio is 1/4, the frequency of the divided clock signal DCLK becomes 250 MHz, the cycle of the divided clock signal DCLK becomes 4 ns, and the enable period becomes 16 ns. Therefore, the output K<0:A> of the counting unit becomes a digital signal that corresponds to 4 obtained by counting the divided clock signal DCLK four times. This is the same as the case where the division ratio is 1. However, when the division ratio is 1/4, a margin for counting the clock signal is four times larger than when the division ratio is 1.

That is, the counting circuit in accordance with the embodiment of the present invention not only may increase the margin for counting the clock signal, but also may have a value obtained by counting the reference clock signal CLK during the enable period, where the division ratio is 1.

Figure 3A:
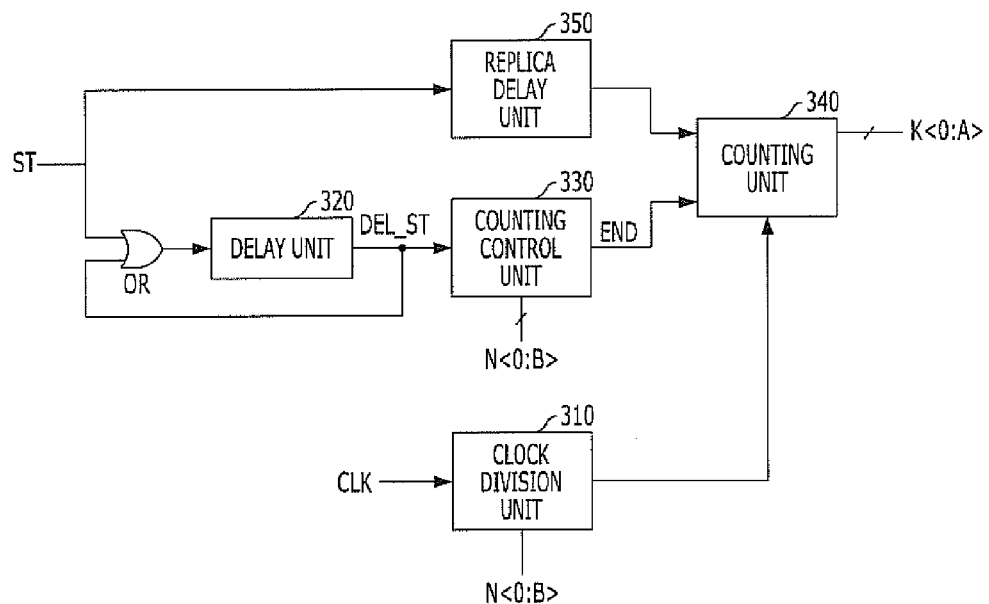
FIG. 3A is a configuration diagram of a delay value quantization circuit for improving a clock counting operation in accordance with another embodiment of the present invention.

FIG. 3A is a configuration diagram of a delay value quantization circuit in accordance with another embodiment of the present invention. The delay value quantization circuit of FIG. 3A is configured to quantize a delay value based on a clock signal, while increasing a margin for counting the clock signal using the principle as the counting circuit of FIG. 2.

Figure 1B:
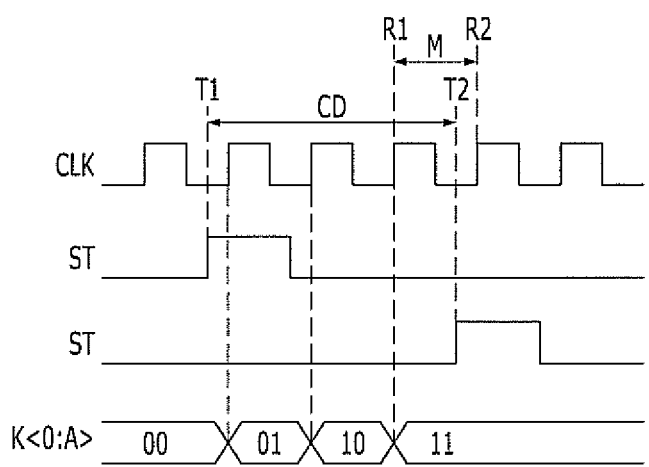
FIG. 1B is a timing diagram for explaining the operation of the circuit of FIG. 1A.

Referring to FIG. 3A, the delay value quantization circuit includes a clock division unit 310, a delay unit 320, a counting control unit 330, and a counting unit 340. The clock division unit 310 is configured to divide a reference clock signal CLK and generate a divided clock signal DCLK. The counting control unit 330 is configured to control the delay unit 320 to delay a start signal ST for a preset number of times, and activate an end signal END when an output signal DEL_ST of the delay unit 320 is activated for the preset number of times. The counting unit 340 is configured to count the divided clock signal DCLK from an activation time point of the start signal ST to an activation time point of the end signal END. Here, a delay value of the delay unit 320 corresponds to the enable period when the division ratio is 1 in FIG. 1.

Hereafter, referring to FIG. 3A, the delay value quantization circuit will be described.

The clock division unit 310 is configured to generate the divided clock signal DCLK by dividing the clock signal CLK based on a preset division ratio. Division information N<0:B> includes information on the division ratio. The clock division unit 310 may divide the clock signal CLK at the division ratio which is decided based on the division information N<0:B>. However, the clock division unit 310 does not necessarily have to receive the division information N<0:B>, and the division information N<0:B> may be preset. Here, the relationship of frequency and cycle between the reference clock signal CLK and the divided clock signal DLCK based on the division ratio is the same as described with reference to FIG. 2.

The delay unit 320 is configured to generate the output signal DEL_ST by delaying the start signal ST. The start signal ST is a signal for controlling the counting unit 340 to start counting the divided clock signal DCLK. Here, the delay value of the delay unit 320 corresponds to the length of the enable period of the enable signal EN when the division ratio is 1. The counting control unit 330 is configured to control the delay unit 320 to delay the start signal ST for the preset number of times, and activate the end signal END when the output signal DEL_ST of the delay unit is activated for the preset number of times. The end signal END is a signal for controlling the counting unit 340 to end counting of the divided clock signal DLCK. The preset number of times is decided based on the division ratio of the clock division unit 310, and may be set to N when the division ratio is 1/N. The counting control unit 330 may set the preset number of times to a number of times which is decided based on the division information N<0:B>. However, the counting control unit 330 does not necessarily receive the division ratio N<0:B>, but the number may be preset based on the division ratio. Hereafter, a case in which the preset number of times is N will be described. The counting control unit 330 may include a kind of counter circuit configured to count how many times the output signal DEL_ST of the delay unit is activated, and activate the end signal END when the output signal DEL_ST of the delay unit is activated the for preset number of times.

When the start signal ST is delayed for N times by the delay unit 320 based on the control of the counting unit 320, the output signal DEL_ST of the delay unit 320 is activated for N times, and a time point when the output signal DEL_ST of the delay unit 320 is finally activated is delayed by (N×delay value of the delay unit 320) from a time point when the start signal ST is activated. Because the end signal END is activated in response to the output signal DEL_ST of the delay unit that is finally activated, a difference between the activation time point of the start signal ST and the activation time point of the end signal END becomes (N×delay value of the delay unit 320).

The counting unit 340 is configured to count the divided clock signal DCLK from the activation time point of the start signal ST to the activation time point of the end signal END. When the division ratio of the clock division unit 310 is 1/N, the cycle of the divided clock signal DCLK becomes (N×cycle of the reference clock signal CLK), and the length of the period during which the counting unit 340 counts the divided clock signal DCLK becomes (N×delay value of the delay unit 320). Therefore, the output K<0:A> of the counting unit 340, which is a counting result of the counting unit 340, has the same value regardless of the division ratio, because the output K<0:A> of the counting unit is obtained by dividing the length of the counting period by the cycle of the divided clock signal DCLK, and N is offset based on the calculation result. Here, the output K<0:A> of the counting unit may include information obtained by quantizing the delay value of the delay unit 320 based on the reference clock signal CLK.

When the counting control unit 330 activates the end signal END in response to the output signal DEL_ST of the delay unit, a slight delay occurs. Therefore, when the start signal ST is applied to the counting unit 340, the start signal ST may be delayed by the delay occurring in the counting control unit 330, and then applied to the counting unit 340. For this operation, the delay value quantization circuit may include a replica delay unit 350 obtained by modeling the delay value of the counting control unit 330.

That is, the delay value quantization circuit in accordance with the embodiment of the present invention not only may increase a margin for counting the clock signal to perform a high-speed operation, but also may have a value obtained by quantizing the delay value of the delay unit 320 based on the reference clock signal CLK.

Figure 3B:
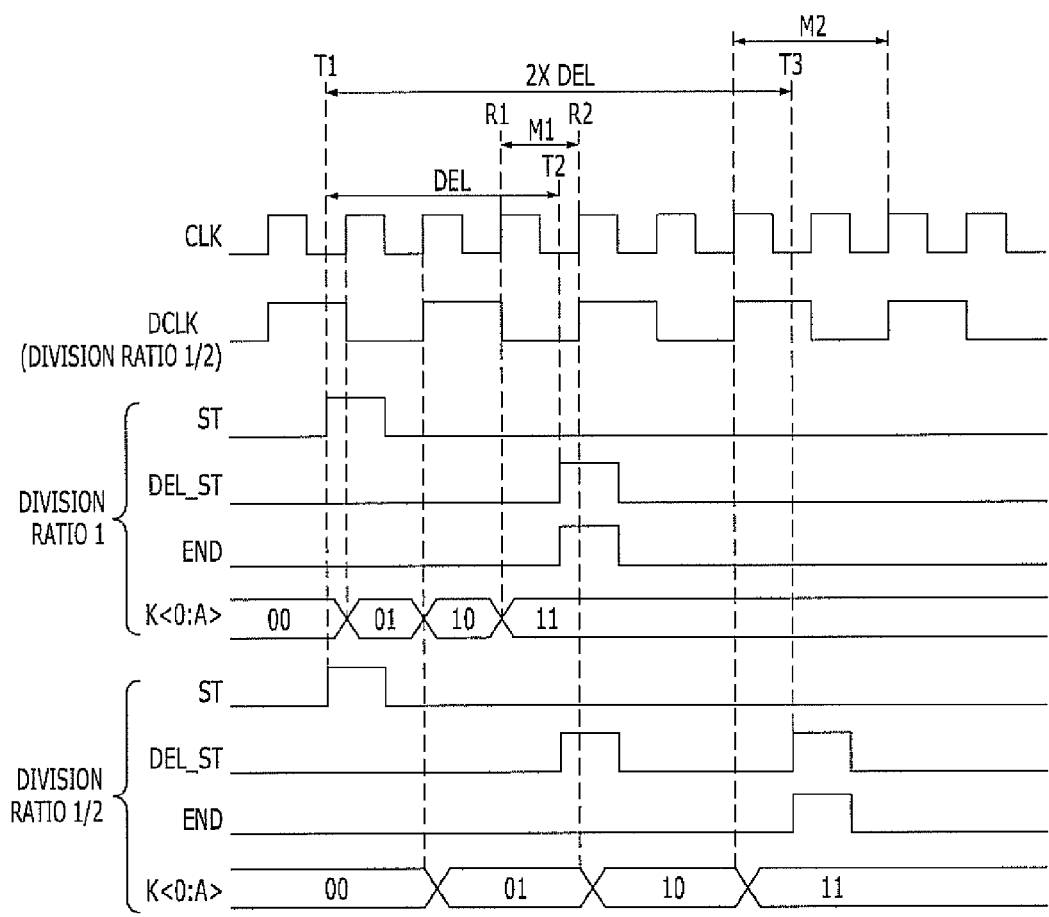
FIG. 3B is a timing diagram for explaining the operation of the delay value quantization circuit of FIG. 3A.

FIG. 3B is a timing diagram for explaining the operation of the delay value quantization circuit of FIG. 3A.

When the clock division unit 310 outputs the divided clock signal DCLK obtained by dividing the reference clock signal CLK at 1/N, the counting unit 340 counts the divided clock signal DCLK from a time point T1 when the start signal ST is activated to a time point when the end signal END is activated (T2 when the division ratio is 1 or T3 when the division ratio is 1/2). Hereafter, the operations of the delay value quantization circuit when the division ratio is 1 and when the division ratio is 1/2, respectively, will be described as follows.

When the division ratio is 1, the frequency and cycle of the divided clock signal DCLK are the same as the reference clock signal CLK. Furthermore, the preset number of times is 1. Therefore, when the output signal DEL_ST of the delay unit is activated one time, the end signal END is activated, and a time between 'T1' and 'T2' is equal to a delay value DEL of the delay unit. The output K<0:A> of the counting unit is obtained by quantizing the delay value DEL of the delay unit based on the reference clock signal CLK. Here, a period M1 between rising edges R1 and R2 of the divided clock signal DCLK, which are positioned before and after the time point T2 when the end signal END is activated, becomes a margin for correctly counting the divided clock signal DCLK.

When the division ratio is 1/2, the frequency of the divided clock signal DCLK becomes 1/2 times smaller than the frequency of the reference clock signal CLK, and the cycle of the divided clock signal DCLK becomes two times longer than the cycle of the reference clock CLK. Furthermore, the preset number of times is 2. Therefore, when the output signal DEL_ST of the delay unit is activated two times, the end signal END is activated, and a time between 'T1' and 'T3' becomes two times larger than the delay value DEL of the delay unit. As described above with reference to FIG. 2, however, the output K<0:A> of the counting unit has a value obtained by quantizing the delay value DEL of the delay unit based on the reference clock signal CLK. Here, a margin M2 between rising edges R3 and R4 of the divided clock signal DCLK, which are positioned before and after the time point T2 when the end signal END is activated, becomes a margin for correctly counting the divided clock signal DCLK. Compared to when the division ratio is 1, it may be seen that the margin for correctly counting the divided clock signal DCLK is doubled.

In FIG. 3B, the case in which the ratio is 1 was compared to the case in which the ratio is 1/2. However, when the division ratio is 1/N, the margin increases N times larger than when the division ratio is 1.

Figure 4:
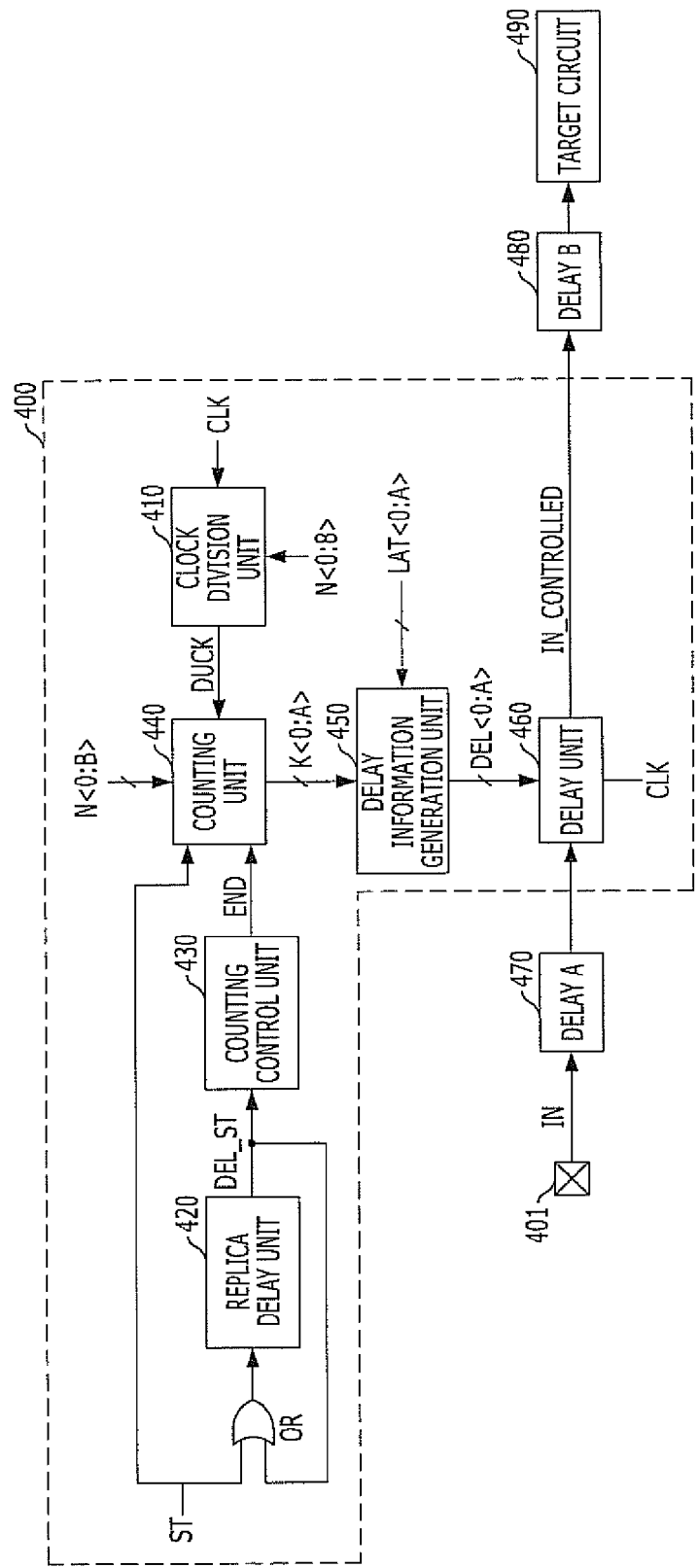
FIG. 4 is a configuration diagram of a latency control circuit for improving a clock counting operation in accordance with another embodiment of the present invention.

FIG. 4 is a configuration diagram of a latency control circuit for improving a clock counting operation in accordance with another embodiment of the present invention. The latency control circuit of FIG. 4 includes the delay value quantization circuit of FIG. 3A, which may not include the replica delay unit 350. The latency control circuit is configured to quantize a delay value for delaying an input signal IN based on a reference clock signal CLK and delay the input signal IN using the quantized value.

Referring to FIG. 4, the latency control circuit 400 includes a clock division unit 410, a replica delay unit 420, a counting control unit 430, a counting unit 440, a delay information generation unit 450, and a delay unit 460. The clock division unit 410 is configured to divide the reference clock signal CLK and generate a divided clock signal DCLK. The replica delay unit 420 has a delay value that corresponds to a path through which the input signal IN passes in an integrated circuit. The counting control unit 430 is configured to control the replica delay unit 420 to delay a start signal ST, which is activated in response to the input signal IN, for a preset number of times, and activate an end signal END when an output signal DEL_ST of the replica delay unit 420 is activated for the preset number of times. The counting unit 440 is configured to count the divided clock signal DCLK from the activation time point of the start signal ST to the activation time point of the end signal END, and generate path information K<0:A> that corresponds to the delay value of the path through which the input signal IN passes in the integrated circuit. The delay information generation unit 450 is configured to generate delay information that indicates a delay value for delaying the input signal IN by using latency information LAT<0:A> of the input signal IN and the path information K<0:A>. The delay unit 460 is configured to delay the input signal IN by the delay information DEL<0:A>.

A delay A 470 indicates a delay in the integrated circuit from which the input signal IN suffers before it is inputted to the latency control circuit 400 from an input pad 401. A delay B 480 indicates a delay in the integrated circuit from which the input signal IN suffers before it is inputted to a target circuit 490 from the latency control circuit 400. That is, the delay A 470 and the delay B 480 indicate a delay from which the input signal suffers on a path through which the input signal passes in the integrated circuit.

The target circuit 490 of FIG. 4 is a circuit to perform an operation indicated by the input signal IN in response to the input signal IN. For example, when the input signal IN indicates a command to perform an X operation and the latency of the input signal IN is determined as seven clocks based on the reference clock signal CLK, the target circuit 490 is a circuit to perform the X operation after seven clocks from a time point when the input signal IN is inputted into the integrated circuit (a time point when the input signal IN is inputted to the input pad 401).

The clock division unit 410, the replica delay unit 420, the counting control unit 430, and the counting unit 440 corresponds to a configuration for generating the path information K<0:A>, which is a value obtained by quantizing the delay value of the delay A 470 and the delay B 480 based on the reference clock signal CLK.

The clock division unit 410 is configured to generate the divided clock signal DCLK by dividing the reference clock signal CLK based on a preset division ratio. The division information N<0:B> includes information on the division ratio. The clock division unit 410 may divide the clock signal CLK at the division ratio, which is decided based on the division information N<0:B>. However, the clock division unit 410 does not necessarily have to receive the division information N<0:B>, and the division information N<0:B> may be preset. Here, the relationship of frequency and cycle between the reference clock signal CLK and the divided clock DLCK is the same as described above with reference to FIG. 2.

The replica delay unit 420 is configured to generate the output signal DEL_ST by delaying the start signal ST. The start signal ST is a signal for controlling the counting unit 440 to start counting the divided clock signal DCLK. Here, the delay unit 440 is a circuit configured by modeling the delay values of the delay A 470 and the delay B 480 from which the input signal IN suffers delay outside the latency control circuit 400 in the integrated circuit, and the delay value of the delay unit 460 is equal to the sum of the delay value of the delay A 470 and the delay value of the delay B 480. For reference, the start signal ST may include the input signal IN or another signal activated at the time point when the input signal IN is inputted.

The counting control unit 430 is configured to control the replica delay unit 420 to delay the start signal ST for the preset number of times, and activate the end signal END when the output signal DEL_ST of the delay unit is activated for the preset number of times. The end signal END is a signal for controlling the counting unit 440 to end counting the divided clock signal DCLK. The preset number of times is decided based on the division ratio of the clock division unit 410. When the division ratio is 1/N, the preset number of times may be set to N. The counting control circuit 430 may set the preset number of times to a number of times, which is decided based on the division information N<0:B>. However, the counting control unit 430 does not necessarily receive the division information N<0:B>, and the preset number of times may be set based on the division ratio. Hereafter, the case in which the preset number of times is N will be described. The counting control unit 430 may include a kind of counter circuit, which counts how many times the output signal DEL_ST of the delay unit is activated, and activates the end signal END when the output signal DEL_ST of the delay unit is activated for the preset number of times.

When the start signal ST is delayed N times by the replica delay unit 420 based on the control of the counting control unit 430, the output signal DEL_ST of the delay unit is activated for N times, and a time point when the output signal DEL_ST of the delay unit is finally activated corresponds to a time point when the start signal ST is delayed by (N×delay value of the replica delay unit 420) from a time point when the start signal ST is activated. Because the end signal END is activated in response to the output signal DEL_ST of the delay unit which is finally activated, a difference between the activation time point of the start signal ST and the activation time point of the end signal END corresponds to (N×delay value of the replica delay unit 420).

The counting unit 440 is configured to generate the path information K<0:A> by counting the divided clock signal DCLK from the activation time point of the start signal ST to the activation time point of the end signal END. When the division ratio of the clock division unit 410 is 1/N, the cycle of the divided clock signal DCLK becomes (N×cycle of the reference clock signal CLK), and the length of the period during which the counting unit 440 counts the divided clock signal DCLK becomes (N×delay value of the replica delay unit 420). Therefore, the path information K<0:A>, which is the counting result of the counting unit 440, has the same value regardless of the division ratio, because the path information K<0:A> is obtained by dividing the length of the counting period by the cycle of the divided clock signal DCLK, and N is offset based on the calculation result. Here, the path information K<0:A> may include information obtained by quantizing the delay value of the replica delay unit 420 based on the reference clock signal CLK. As described above, the delay value of the replica delay unit 420 is equal to the sum of the delay value of the delay A 470 and the delay value of the delay B 480. Therefore, the path information K<0:A> corresponds to a value obtained by quantizing the sum of the delay value of the delay A 470 and the delay value of the delay B 480 based on the reference clock signal CLK.

The delay information generation unit 450 is configured to generate the delay information DEL<0:A> that indicates a value for delaying the input signal IN by using latency information LAT<0:A> of the input signal IN and the path information K<0:A>. For reference, the latency information LAT<0:A> indicates a latency value. The delay information generation unit 450 generates the delay information DEL<0:A> by subtracting the value of the path information K<0:A> from the value of the latency information LAT<0:A> (that is, delay information DEL<0:2>=latency information LAT<0:A>−path information K<0:A>). For reference, the bit numbers of the respective pieces of information K<0:A>, LAT<0:B>, and DEL<0:A> may differ depending on the design. The delay information generation unit 450 may include a simple subtract circuit.

The delay unit 460 is configured to delay the input signal IN by the delay information DEL<0:A>. The delay unit 460 delays the input signal IN by clocks that correspond to the number indicated by the delay information DEL<0:A> based on the reference clock signal CLK. For example, when the delay information DEL<0:A> indicates '4', the delay unit 460 delays the input signal IN by four clocks. The delay unit 460 may include a shifting circuit, which shifts the input signal IN by the number that corresponds to the delay information DEL<0:A> in synchronization with the reference clock signal CLK. The shifting circuit may include a plurality of D-flip flops connected in series.

According to the entire operation of the latency control circuit, the clock division unit 410, the replica delay unit 420, the counting control unit 430, and the counting unit 440 generate the path information K<0:A>, which is obtained by quantizing the delay value from which the input signal IN suffers delay in the integrated circuit based on the reference clock signal CLK. The delay value is equal to the sum of the delay value of the delay A 470 and the delay value of the delay B 480. Furthermore, the delay information generation unit 450 generates the delay information DEL<0:A> by subtracting the value of the path information K<0:A> from the value of the latency information LAT<0:A>. Then, the delay unit 460 delays the input signal IN by the delay value that corresponds to the delay information DEL<0:A> and outputs the delayed signal as a signal IN_CONTROLLED. That is, the delay unit 460 delays the input signal A by a value corresponding to (latency—delay from which the input signal suffers in the integrated circuit), and the input signal IN suffers from the delay in the integrated circuit while reaching the target circuit 490. Therefore, the input signal IN reaches the target circuit 490 after a time that corresponds to the latency correctly passes, because the input signal IN was inputted into the integrated circuit.

The latency control circuit in accordance with the embodiment of the present invention counts the divided clock signal DCLK obtained by dividing the reference clock signal CLK of the integrated circuit and generates the path information K<0:A>. Therefore, since the margin for correctly counting the clock signal increases, the integrated circuit may correctly operate even during a high-speed or high-frequency operation.

Hereafter, referring to FIG. 4, a case in which the latency control circuit in accordance with the embodiment of the present invention, which is applied to a memory to perform a read operation, will be described as follows.

When the memory is powered on, the latency control circuit 400 receives the latency information LAT<0:A> and generates the path information K<0:A> in a period where the operation environment of the memory is set (hereafter, referred to as a setting period). Furthermore, the latency control circuit 400 generates the delay information DEL<0:A> by using the inputted latency information LAT<0:A> and the generated path information K<0:A>, and stores the generated delay information DEL<0:A>. This operation will be described in more detail.

When the memory is powered on, the clock division unit 410 generates the divided clock signal DCLK by dividing the reference clock signal CLK based on a preset division ratio (hereafter, the division ratio is set to 1/N). When a command for setting the delay information DEL<0:A> (hereafter, referred to as a setting command) is inputted as the input signal IN, the start signal ST is activated. Therefore, the counting unit 440 starts to count the divided clock signal DCLK from a time point when the setting command is inputted, and the setting command is delayed by the delay value in the memory whenever the setting command passes through the replica delay unit 420 each time. The delay value corresponds to the sum of the delay value of the delay A 470 and the delay value of the delay B 480. When the setting command passes the replica delay unit 420 for a preset number of times, the counting control unit 430 activates the end signal END. The preset number of times is set to N because the division ratio is 1/N. Furthermore, the counting unit 440 ends counting in response to the end signal END, and generates the path information K<0:A>, which is obtained by quantizing the delay value in the memory based on the reference clock signal CLK. The delay information generation unit 450 generates the delay information DEL<0:A> by subtracting the value of the path information K<0:A> from the value of the latency information LAT<0:A>, and stores the generated delay information DEL<0:A>.

Here, when the path information K<0:A> is generated by using the divided clock signal DLCK instead of the reference clock signal CLK, it takes a long time for counting. However, because the sufficient setting period is given, the counting time substantially has no effect on the operation speed of the memory.

When a read command is applied after the operation environment of the memory is completely set, data are outputted through the following process. When the read command is applied as the input signal IN to the input pad 401, the read command is inputted to the latency control circuit 400 through the delay A 470. The delay unit 460 delays the read command by a delay value corresponding to the delay information DEL<0:A>, which is generated in the setting period and stored in the delay information generation unit 450. Then, the read command reaches the target circuit 490 through the delay B 480. Here, the target circuit 490 may include a data output circuit of the memory, which stores data outputted from a memory cell in response to the read command and outputs the stored data when the read command reaches the data output circuit. The data output circuit outputs the stored data when the read command reaches the data output circuit.

The delay value by which the delay unit 460 delays the read command corresponds to (latency value—delay value in the memory), and the read command suffers from the delay value in the memory (that is, the read command passes through the delay A 470 and the delay B 480). Therefore, the read command reaches the target circuit 490 at a time point when the latency passes from a time point when the read command is applied. Accordingly, the memory may output data at the time point when the latency passes from the time point when the read command is applied. For reference, the latency information LAT<0:A> may include information on CAS latency.

In accordance with the embodiments of the present invention, the clock counting margin may be increased during the clock counting operation, which makes it possible to correctly count even a clock signal that has a high frequency.

While the present invention has been described with respect to the specific embodiments, it will be apparent to those skilled in the art that various changes and modifications may be made without departing from the spirit and scope of the invention as defined in the following claims.

What is claimed is:

1. A delay value quantization circuit comprising:
   a clock division unit configured to divide a reference clock signal and to generate a divided clock signal;
   a delay unit;
   a counting control unit configured to control the delay unit to delay a start signal for a preset number of times, and activate an end signal after an output signal of the delay unit is activated for the preset number of times; and
   a counting unit configured to count the divided clock signal from an activation time point of the start signal to an activation time point of the end signal.

2. The delay value quantization circuit of claim 1, wherein an output of the counting unit comprises information obtained by quantizing a delay value of the delay unit based on the reference clock signal.

3. The delay value quantization circuit of claim 1, wherein the preset number of times is decided based on a division ratio of the clock division unit.

4. The delay value quantization circuit of claim 3, wherein, when the division ratio is 1/N, the preset number of times is set to N.

5. The delay value quantization circuit of claim 3, wherein a counting result of the counting unit has the same value regardless of the preset division ratio.

* * * * *